(12) United States Patent
Sun et al.

(10) Patent No.: US 10,153,298 B2
(45) Date of Patent: *Dec. 11, 2018

(54) INTEGRATED STRUCTURES AND METHODS OF FORMING VERTICALLY-STACKED MEMORY CELLS

(71) Applicant: Micron Technology, Inc., Boise, ID (US)

(72) Inventors: Jie Sun, Boise, ID (US); Fatma Arzum Simsek-Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/893,380

(22) Filed: Feb. 9, 2018

(65) Prior Publication Data

US 2018/0166464 A1 Jun. 14, 2018

Related U.S. Application Data

(60) Division of application No. 15/472,052, filed on Mar. 28, 2017, now Pat. No. 9,899,413, which is a
(Continued)

(51) Int. Cl.
*H01L 23/00* (2006.01)
*H01L 27/11582* (2017.01)
(Continued)

(52) U.S. Cl.
CPC .... *H01L 27/11582* (2013.01); *H01L 21/0217* (2013.01); *H01L 21/02164* (2013.01);
(Continued)

(58) Field of Classification Search
CPC ............ H01L 27/115; H01L 27/11524; H01L 27/11556; H01L 27/1157; H01L 27/11582;
(Continued)

(56) References Cited

U.S. PATENT DOCUMENTS

2009/0242966 A1 10/2009 Son
2010/0013046 A1* 1/2010 Hotta ................ H01L 21/76801
257/529

(Continued)

*Primary Examiner* — Long K Tran
(74) *Attorney, Agent, or Firm* — Wells St. John P.S.

(57) ABSTRACT

Some embodiments include an integrated structure having a stack of alternating dielectric levels and conductive levels, vertically-stacked memory cells within the conductive levels, an insulative material over the stack and a select gate material over the insulative material. An opening extends through the select gate material, through the insulative material, and through the stack of alternating dielectric and conductive levels. A first region of the opening within the insulative material is wider along a cross-section than a second region of the opening within the select gate material, and is wider along the cross-section than a third region of the opening within the stack of alternating dielectric levels and conductive levels. Channel material is within the opening and adjacent the insulative material, the select gate material and the memory cells. Some embodiments include methods of forming vertically-stacked memory cells.

13 Claims, 14 Drawing Sheets

Related U.S. Application Data continuation of application No. 15/248,968, filed on Aug. 26, 2016, now Pat. No. 9,634,025, which is a division of application No. 14/796,938, filed on Jul. 10, 2015, now Pat. No. 9,455,261.

(51) Int. Cl.
| | | |
|---|---|---|
| *H01L 27/115* | (2017.01) | |
| *H01L 21/02* | (2006.01) | |
| *H01L 21/28* | (2006.01) | |
| *H01L 27/11524* | (2017.01) | |
| *H01L 27/11556* | (2017.01) | |
| *H01L 27/1157* | (2017.01) | |
| *H01L 21/768* | (2006.01) | |
| *H01L 23/522* | (2006.01) | |
| *H01L 23/528* | (2006.01) | |
| *H01L 23/532* | (2006.01) | |

(52) U.S. Cl.
CPC .. *H01L 21/02244* (2013.01); *H01L 21/02274* (2013.01); *H01L 21/28273* (2013.01); *H01L 21/28282* (2013.01); *H01L 21/76816* (2013.01); *H01L 21/76877* (2013.01); *H01L 23/528* (2013.01); *H01L 23/5226* (2013.01); *H01L 23/53271* (2013.01); *H01L 27/115* (2013.01); *H01L 27/1157* (2013.01); *H01L 27/11524* (2013.01); *H01L 27/11556* (2013.01)

(58) Field of Classification Search
CPC ............... H01L 23/5226; H01L 23/528; H01L 23/53271; H01L 21/02164; H01L 21/0217; H01L 21/02244; H01L 21/02274; H01L 21/28273; H01L 21/28282; H01L 21/76816; H01L 21/76877; H05K 999/99
USPC .................................. 257/314, 315, 324, 326
See application file for complete search history.

(56) References Cited

U.S. PATENT DOCUMENTS

| | | |
|---|---|---|
| 2010/0013049 A1 | 1/2010 | Tanaka |
| 2010/0237400 A1 | 9/2010 | Aoyama |
| 2011/0147823 A1 | 6/2011 | Kuk et al. |
| 2011/0233652 A1* | 9/2011 | Shino ............... H01L 27/11578 257/324 |
| 2014/0003148 A1 | 1/2014 | Sun |
| 2014/0254281 A1 | 9/2014 | Yoo et al. |

* cited by examiner

INTEGRATED STRUCTURES AND METHODS OF FORMING VERTICALLY-STACKED MEMORY CELLS

RELATED PATENT DATA

This patent resulted from a divisional of U.S. patent application Ser. No. 15/472,052 which was filed Mar. 28, 2017, which is a continuation of U.S. patent application Ser. No. 15/248,968, which was filed Aug. 26, 2016, which issued as U.S. Pat. No. 9,634,025; which resulted from a divisional of U.S. patent application Ser. No. 14/796,938, which was filed Jul. 10, 2015, which issued as U.S. Pat. No. 9,455,261, each of which is hereby incorporated herein by reference in its entirety.

TECHNICAL FIELD

Integrated structures and methods of forming vertically-stacked memory cells.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured to comprise vertically-stacked memory cells. It is desired to develop improved NAND architecture, and improved methods of forming NAND architecture.

DETAILED DESCRIPTION OF THE ILLUSTRATED EMBODIMENTS

In some embodiments, monolithic channel material is formed adjacent (i.e., along) a drain-side select gate (SGD), a source-side select gate (SGS) and memory cells during fabrication of vertical NAND strings. Formation of the monolithic channel material may be enabled through utilization of an insulative material between the SGD and a vertical stack of memory cells, and through formation of a widened region of an opening extending through the insulative material relative to regions of the opening extending through the SGD and the memory cells. Example embodiments are described with reference to FIGS. 1-14.

Figure 1:
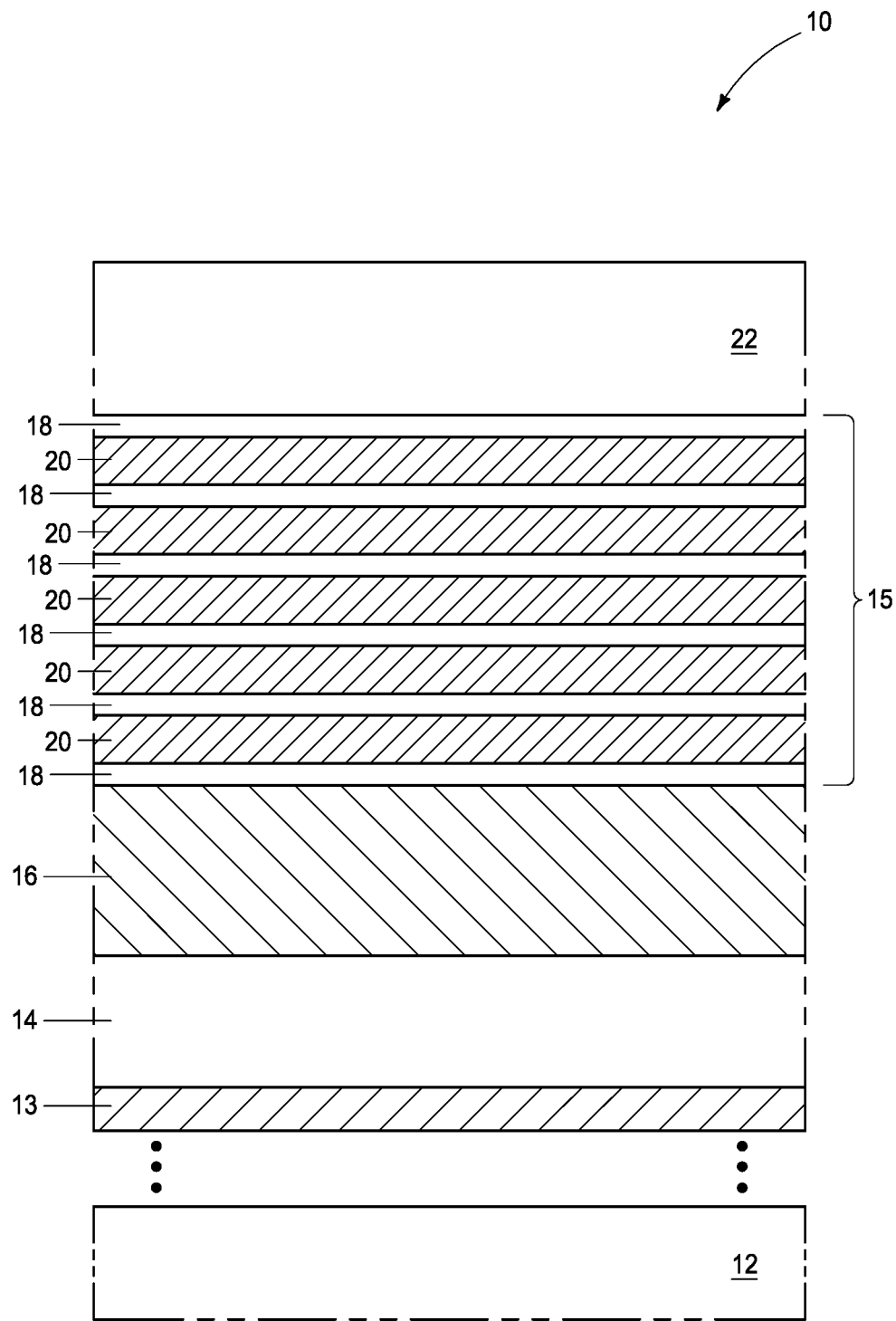
FIGS. 1-14 are cross-sectional views of a semiconductor construction at process stages of an example embodiment method of forming integrated structures.

Referring to FIG. 1, a semiconductor construction 10 is shown to comprise a stack 15 of alternating first and second levels 18 and 20. The levels 18 may be dielectric, and the levels 20 may be conductive. The conductive levels 20 may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, the conductive levels 20 may comprise n-type doped polycrystalline silicon (i.e., n-type doped polysilicon). The dielectric levels 18 may comprise any suitable composition or combination of compositions; and may, for example, comprise silicon dioxide.

The levels 18 and 20 may be of any suitable thicknesses; and may, for example, have thicknesses within a range of from about 10 nm to about 300 nm. In some applications, the levels 18 may be thinner than the levels 20. For instance, levels 18 may be about 20 nm thick and levels 20 may be about 30 nm thick.

The conductive levels 20 may be utilized to pattern control gates of flash devices. In such applications, a vertical string of memory cells (such as, for example, a vertical NAND string of memory cells) may be fabricated, with the number of memory cells in each string being determined by the number of conductive levels 20. The stack may comprise any suitable number of conductive levels. For instance, the stack may have 8 conductive levels, 16 conductive levels, 32 conductive levels, 64 conductive levels, etc.

The stack is over a select gate material 16, which is over an etchstop material 14. In some embodiments, the select gate material 16 may be source-side select gate material (SGS material).

The SGS material 16 may comprise any suitable electrically conductive composition or combination of compositions; and may, for example, comprise p-type doped silicon and/or other suitable conductively-doped semiconductor material.

The etchstop material 14 may comprise, for example, one or more oxides; such as, for example, one or more of aluminum oxide, hafnium oxide, etc.

The etchstop material 14 is over a source material 13. The source material may comprise any suitable electrically conductive material; and may, for example, comprise metal (e.g., copper, titanium, tungsten, etc.), metal-containing composition (e.g., metal carbide, metal nitride, metal silicide, etc.) and/or conductively-doped semiconductor material (e.g., conductively-doped silicon, conductively-doped germanium, etc.).

The source material 13 is supported by a base 12. A break is provided between the material 13 and the base 12 to indicate that there may be additional materials and/or integrated circuit structures between the base and the material 13.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

An insulative material 22 is over stack 15. The material 22 may comprise any suitable composition or combination of compositions; and may, for example, comprise, consist essentially of, or consist of silicon dioxide.

The insulative material 22 may be formed to any suitable thickness, and in some embodiments may be formed to a thickness of from about 50 nm to about 150 nm.

The construction of FIG. 1 may be formed with any suitable processing. For instance, the materials 13, 14, 16, 18, 20 and 22 may be formed in sequential order over base 12 using one or more of atomic layer deposition (ALD), chemical vapor deposition (CVD), and physical vapor deposition (PVD) with appropriate deposition parameters and materials, and utilizing one or more process chambers.

Figure 2:
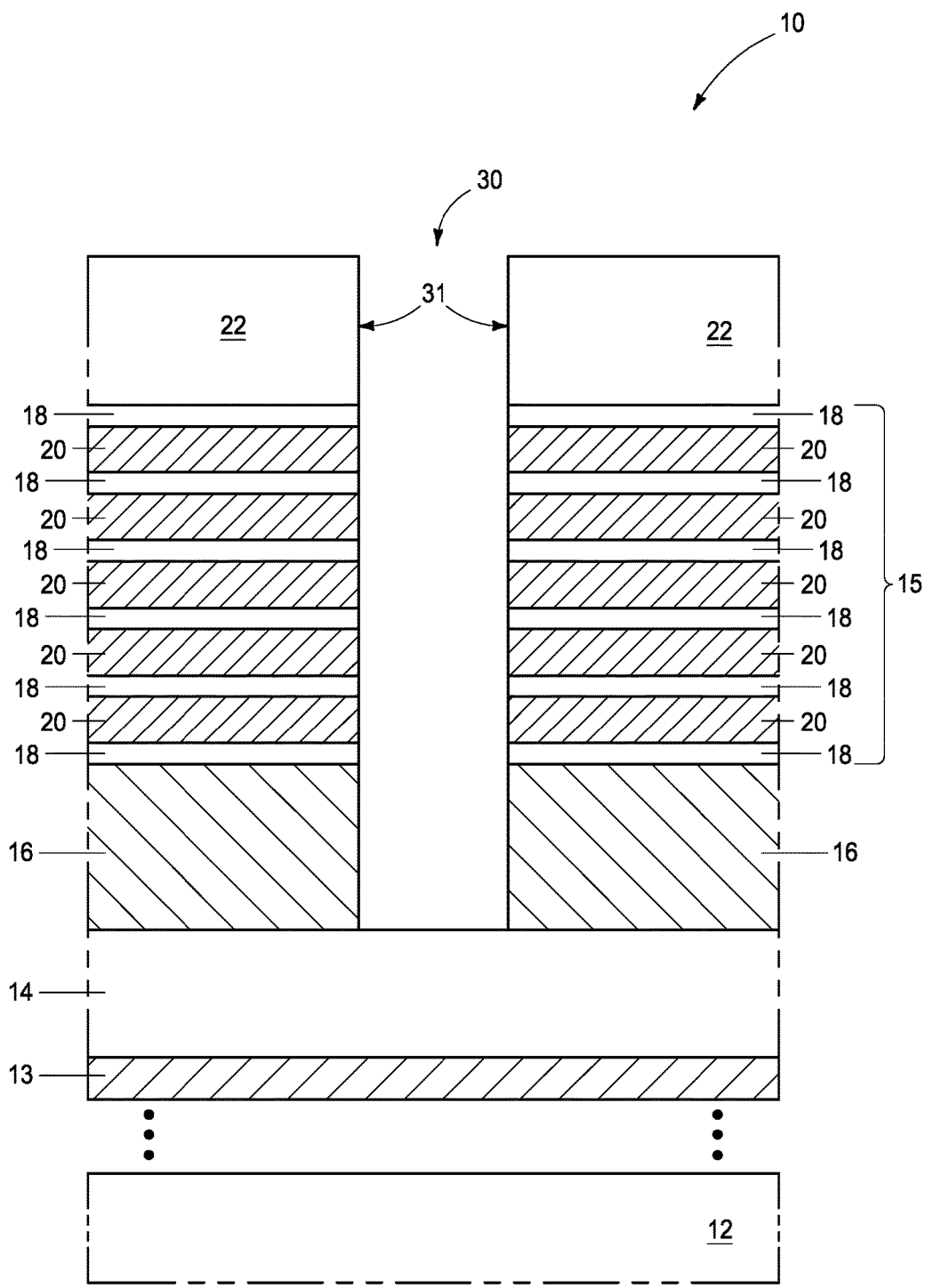

Referring to FIG. 2, an opening 30 is formed to extend through materials 16, 18, 20 and 22. The opening 30 extends to the etchstop material 14, and may even extend partially into such etchstop material. However, the opening does not extend entirely through the etchstop material. The illustrated opening is an example, and a plurality of such openings may be formed during fabrication of an integrated assembly (e.g., a NAND memory array).

The opening 30 may be formed utilizing any suitable processing. For instance, a patterned mask (not shown) may be formed over material 22 to define a location of opening 30, and then the opening may be extended through the materials 16, 18, 20 and 22. The patterned mask may be removed during and/or after extending opening 30 into one or more of the materials 16, 18, 20 and 22. The patterned mask utilized to define the opening 30 may be any suitable mask, including, for example, photolithographically-patterned photoresist and/or a mask formed utilizing pitch-multiplication methodologies.

The opening 30 has sidewalls 31. The opening may be a closed shape when viewed from above (for instance, a circle, ellipse, rectangle, square, etc.) so that the illustrated sidewalls 31 are part of a continuous sidewall that extends around such closed shape.

The opening 30 may be a high-aspect-ratio opening, and advantageously has relatively straight sidewalls as shown. However, in some applications the sidewalls may taper without detrimentally affecting subsequent processing and device performance.

Figure 3:
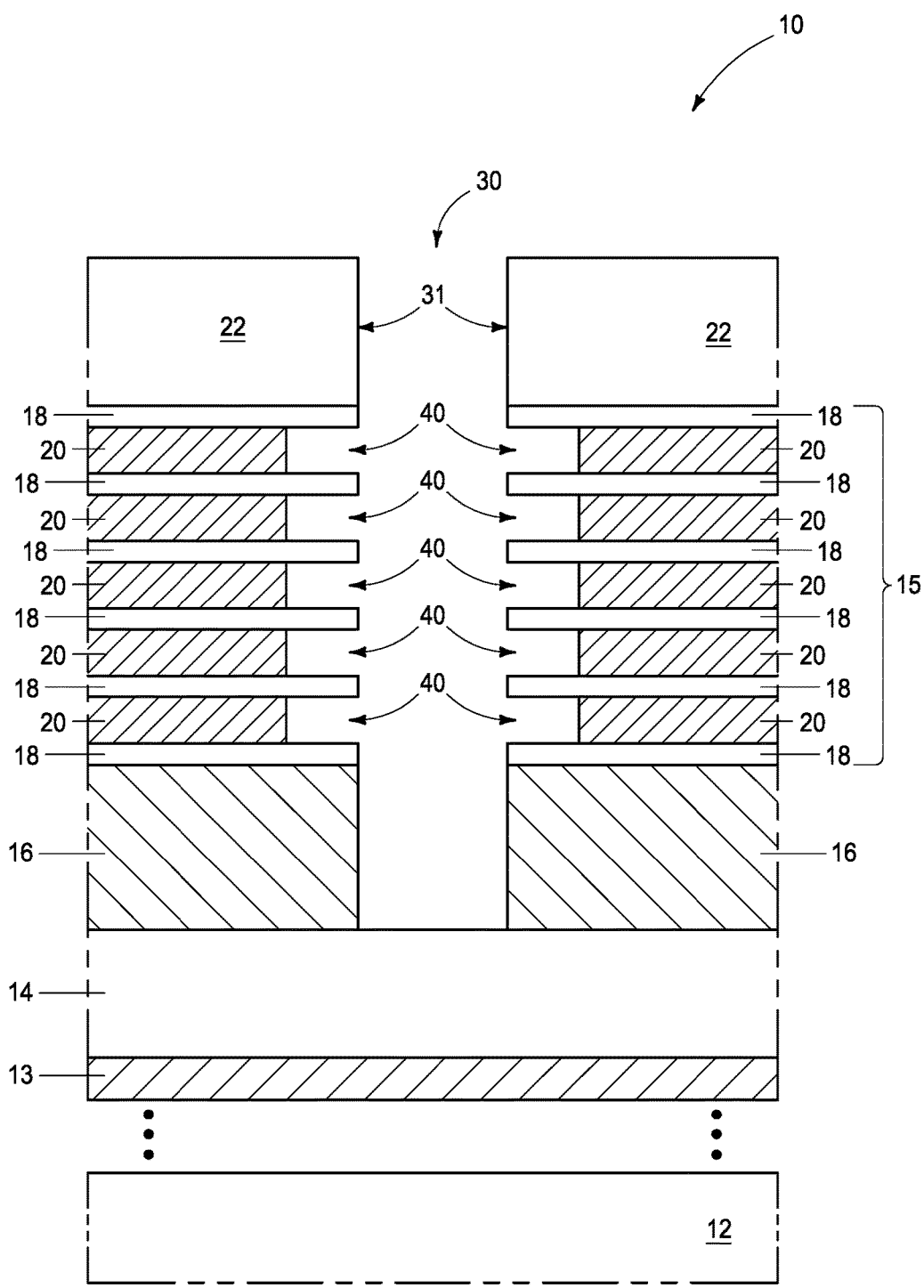

Referring to FIG. 3, cavities 40 are formed to extend into the conductive levels 20 along the sidewalls 31 of opening 30. Such cavities may be formed with an isotropic etch selective for the material of conductive levels 20 relative to the material of dielectric levels 18. In some embodiments, conductive levels 20 comprise conductively-doped silicon, dielectric levels 18 comprise silicon dioxide, and the cavities 40 are formed utilizing tetramethylammonium hydroxide (TMAH).

The conductive material 16 below stack 15 is shown to be substantially resistant to the etch utilized to form cavities 40. In some embodiments, levels 20 comprise n-type doped silicon, conductive material 16 comprises p-type doped silicon; and the conditions utilized to form cavities 40 are substantially selective for n-type doped silicon relative to p-type doped silicon.

Figure 4:
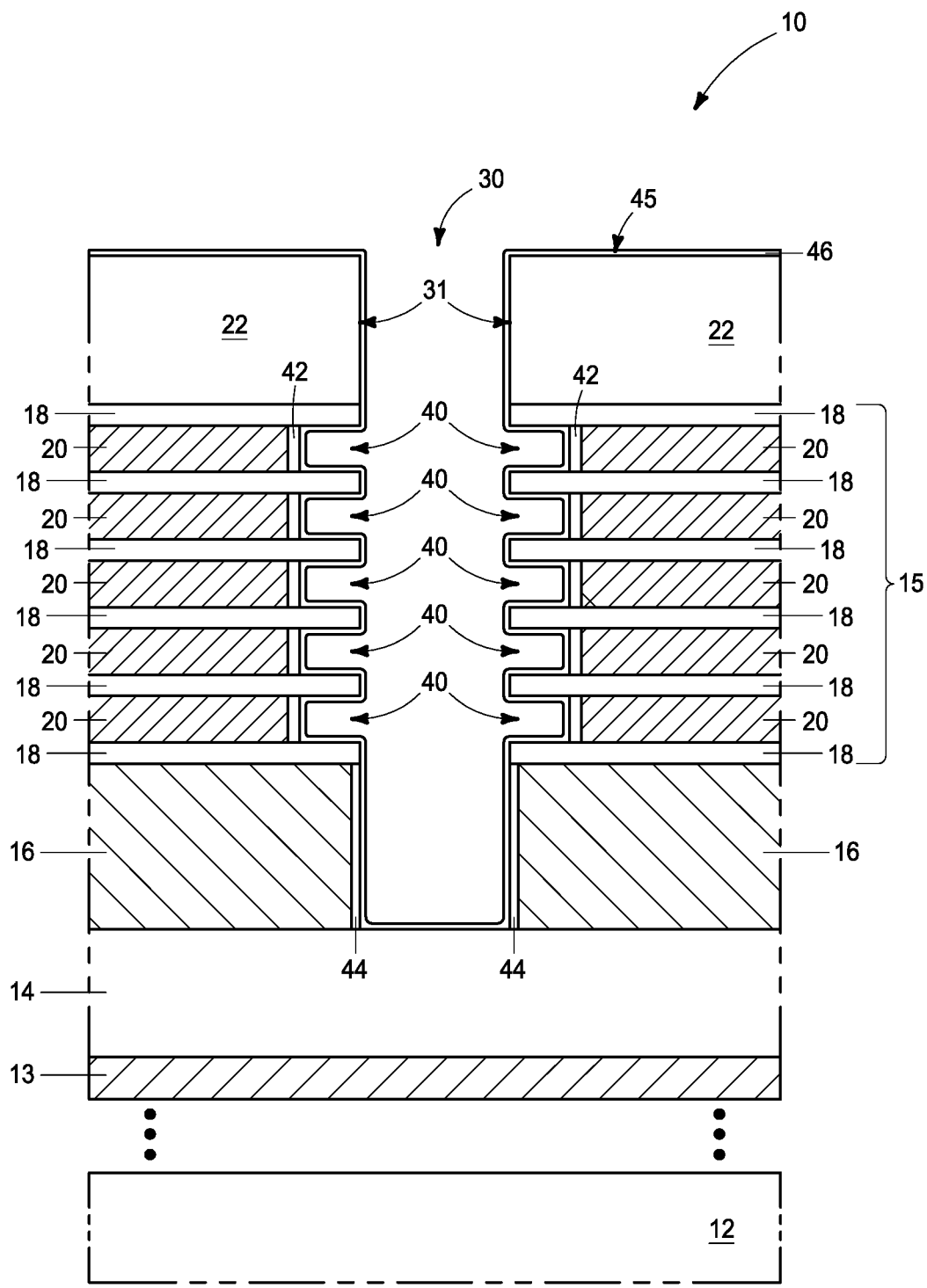

Referring to FIG. 4, exposed regions of conductive levels 20 and SGS material 16 are oxidized to form oxides 42 and 44. In some embodiments, levels 20 and SGS material 16 comprise silicon, and oxides 42 and 44 comprise silicon dioxide. The oxides 42 and 44 may be formed utilizing any suitable methodology, including, for example, in situ steam generation (ISSG).

A liner 45 is formed to extend adjacent (i.e., along) sidewalls 31 of opening 30 and within the cavities 40. The liner 45 comprises liner material 46. Such liner material may be any suitable composition or combination of compositions, and in some embodiments may comprise, consist essentially of, or consist of silicon nitride.

Figure 5:
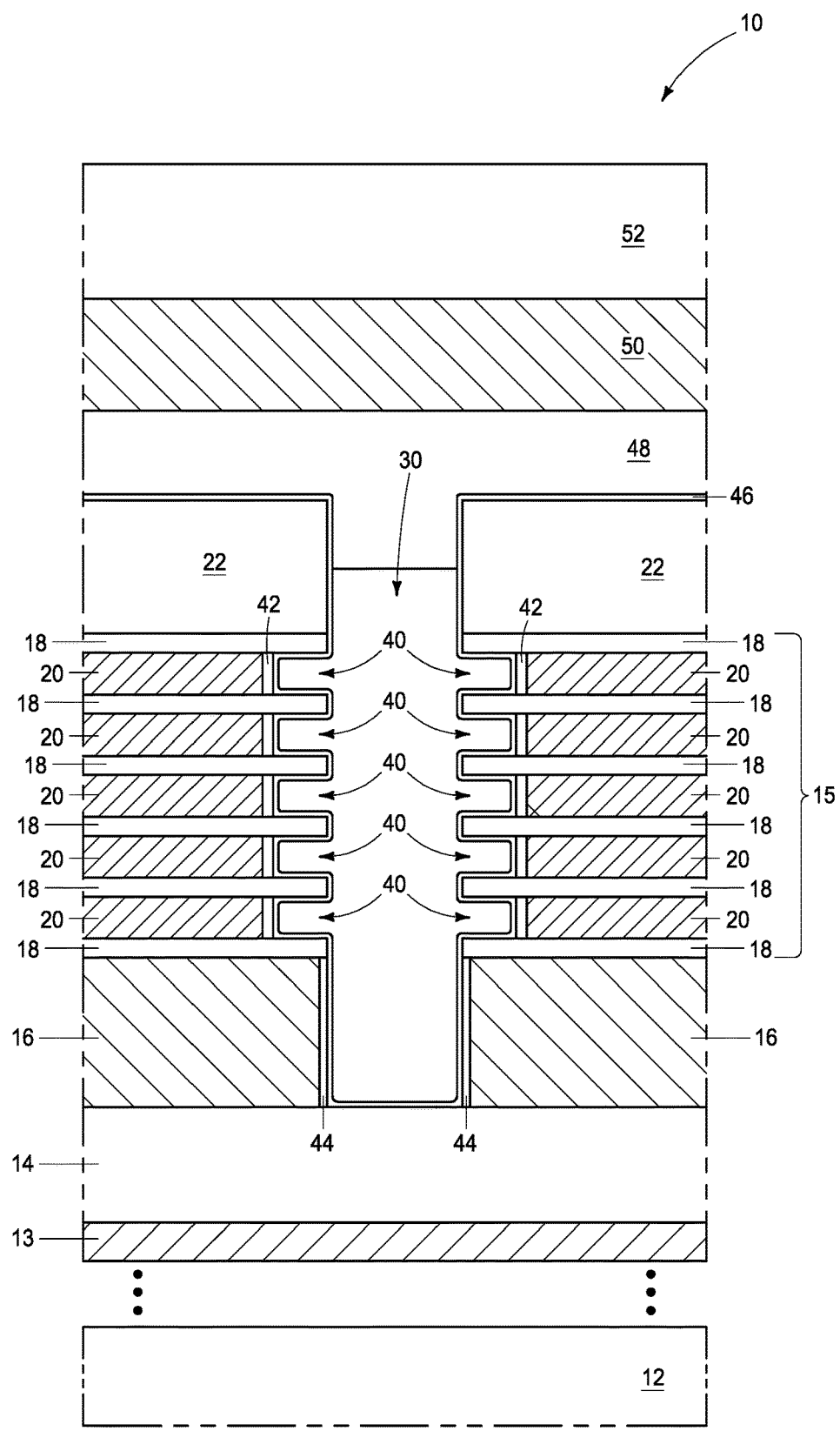

Referring to FIG. 5, insulative material 48 is formed over liner material 46, select gate material 50 is formed over insulative material 48, and another insulative material 52 is formed over the select gate material. In some embodiments, material 50 may be drain-side select gate (SGD) material.

Insulative material 48 may comprise any suitable composition or combination of compositions; and in some embodiments may comprise, consist essentially of, or consist of silicon dioxide. The insulative material 48 may be formed with any suitable processing, including, for example, plasma-enhanced chemical vapor deposition (PECVD). The insulative material 48 is formed to cover the opening 30, but not entirely fill the opening 30. Accordingly, a remaining portion of the opening 30 remains under the insulative material 48. In the shown embodiment, the insulative material 48 extends partially into opening 30, but does not extend to an uppermost level of stack 15. In other embodiments, the insulative material 48 may have other configurations at the processing stage of FIG. 5; and in some embodiments may be over opening 30 without extending into the opening.

The SGD material 50 may comprise any suitable composition or combination of compositions; and in some embodiments may comprise, consist essentially of, or consist of conductively-doped silicon.

The insulative material 52 may comprise any suitable composition or combination of compositions; and in some embodiments may comprise, consist essentially of, or consist of silicon nitride.

The insulative materials 22, 48 and 52 may be referred to as first, second and third insulative materials, respectively, to distinguish them from one another. Alternatively, in some embodiments materials 22, 46, 48 and 52 may be referred to as first, second, third and fourth insulative materials, respectively, to distinguish them from one another.

Figure 6:
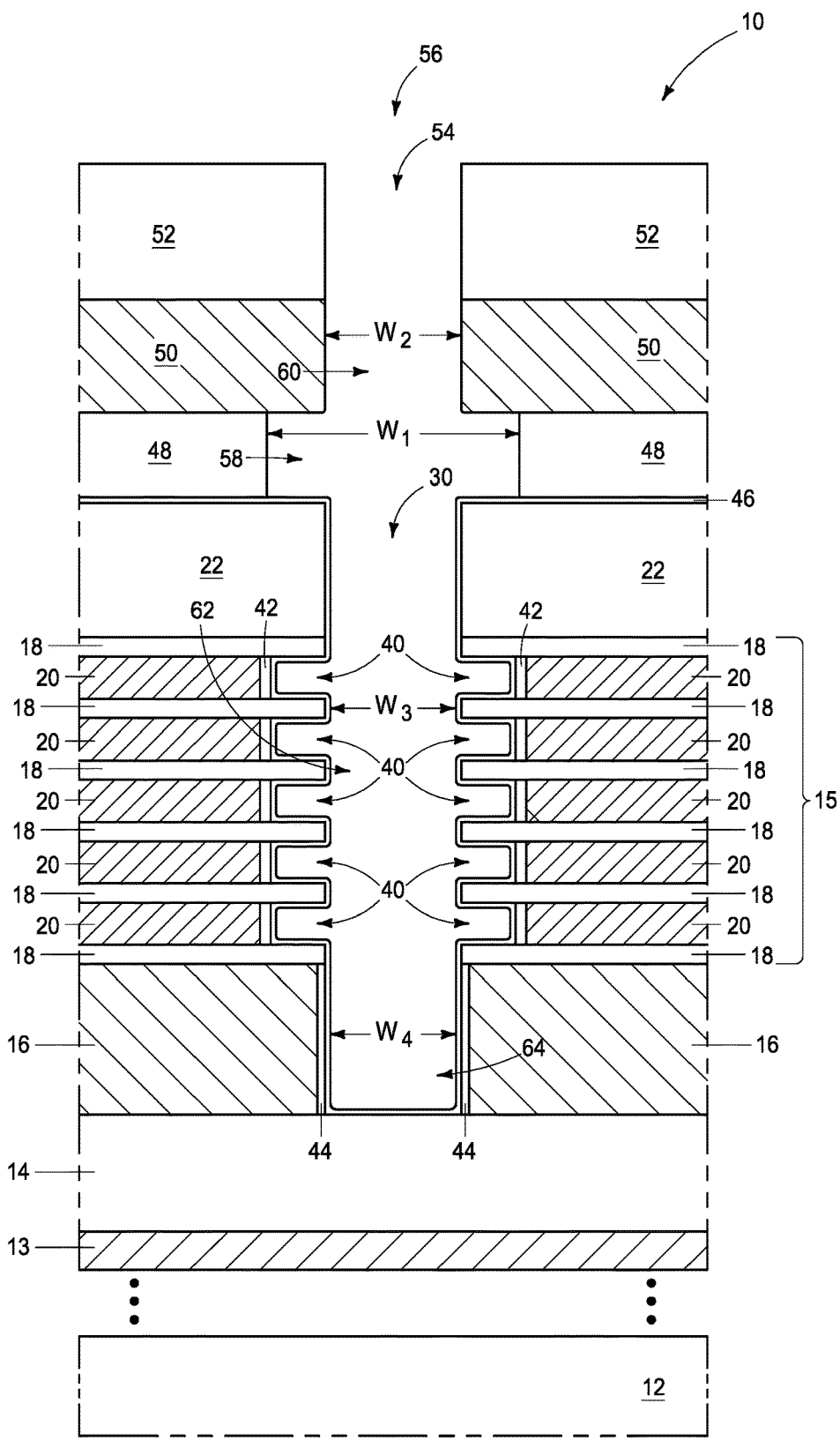

Referring to FIG. 6, an opening 54 is formed to extend through materials 48, 50 and 52 to join with the first opening 30. Opening 54 may be referred to as a second opening, and the openings 54 and 30 may be together considered to form a third opening 56. The opening 54 may be formed with any suitable processing. For instance, in some embodiments a first dry etch may be utilized to punch through materials 50 and 52, and then a second wet etch (for instance, an etch utilizing hydrofluoric acid) may be utilized to extend the opening 54 through oxide material 48. A mask (not shown) may be utilized to define a location of opening 54, and such mask may be removed after formation of the opening.

The third opening 56 they be considered to have a first region 58 where the opening passes through material 48, a second region 60 where the opening passes through material 50, a third region 62 where the opening passes through stack 15, and a fourth region 64 where the opening passes through SGS material 16. In the shown embodiment, the first region 58 is wider than the second, third and fourth regions 60, 62 and 64 along the cross-section of FIG. 6. Such may be beneficial during subsequent etching of materials within regions 62 and 64 of the opening (for instance, etchings described below with reference to FIGS. 8, 11 and 12). In some embodiments, there may be little benefit achieved utilizing the widened region 58 of the opening 56, and in such embodiments the opening 56 may have a substantially constant width throughout all of the regions 58, 60, 62 and 64 (i.e., all of the regions 58, 60, 62 and 64 may have about the same width along the cross-section section of FIG. 6 as one another; with widths being "about the same as one another" if variation amongst the widths is less than or equal to about 2 nm). In the illustrated embodiment, widths $W_3$ and $W_4$ (i.e., the widths of regions 62 and 64) are approximately identical to one another, and may vary slightly from width $W_2$ (i.e., the width of region 60) due to the presence of nitride 46 within regions 62 and 64.

In embodiments in which region 58 is wider than regions 60, 62 and 64 of opening 56, any suitable dimensions may be utilized for the various regions of the opening. For instance, in some embodiments region 58 may have a width $W_1$ along the cross-section of FIG. 6 of from about 60 nanometers (nm) to about 75 nm; and regions 60, 62 and 64 may have widths $W_2$, $W_3$ and $W_4$ within a range of from about 55 nm to about 65 nm. Accordingly, the first region 58 of opening 56 may be wider than the second, third and fourth regions 60, 62 and 64 by an amount within a range of from about 5 nm to about 20 nm. In some embodiments, the first region 58 of opening 56 may be wider than the second, third and fourth regions 60, 62 and 64 by an amount within a range of from about 3 nm to about 25 nm.

Although regions 60, 62 and 64 are all illustrated to have about the same widths as one another, in other embodiments at least one of the regions 60, 62 and 64 may have a substantially different width (i.e., a width greater than about 2 nm different) relative to another of the regions 60, 62 and 64.

Figure 7:
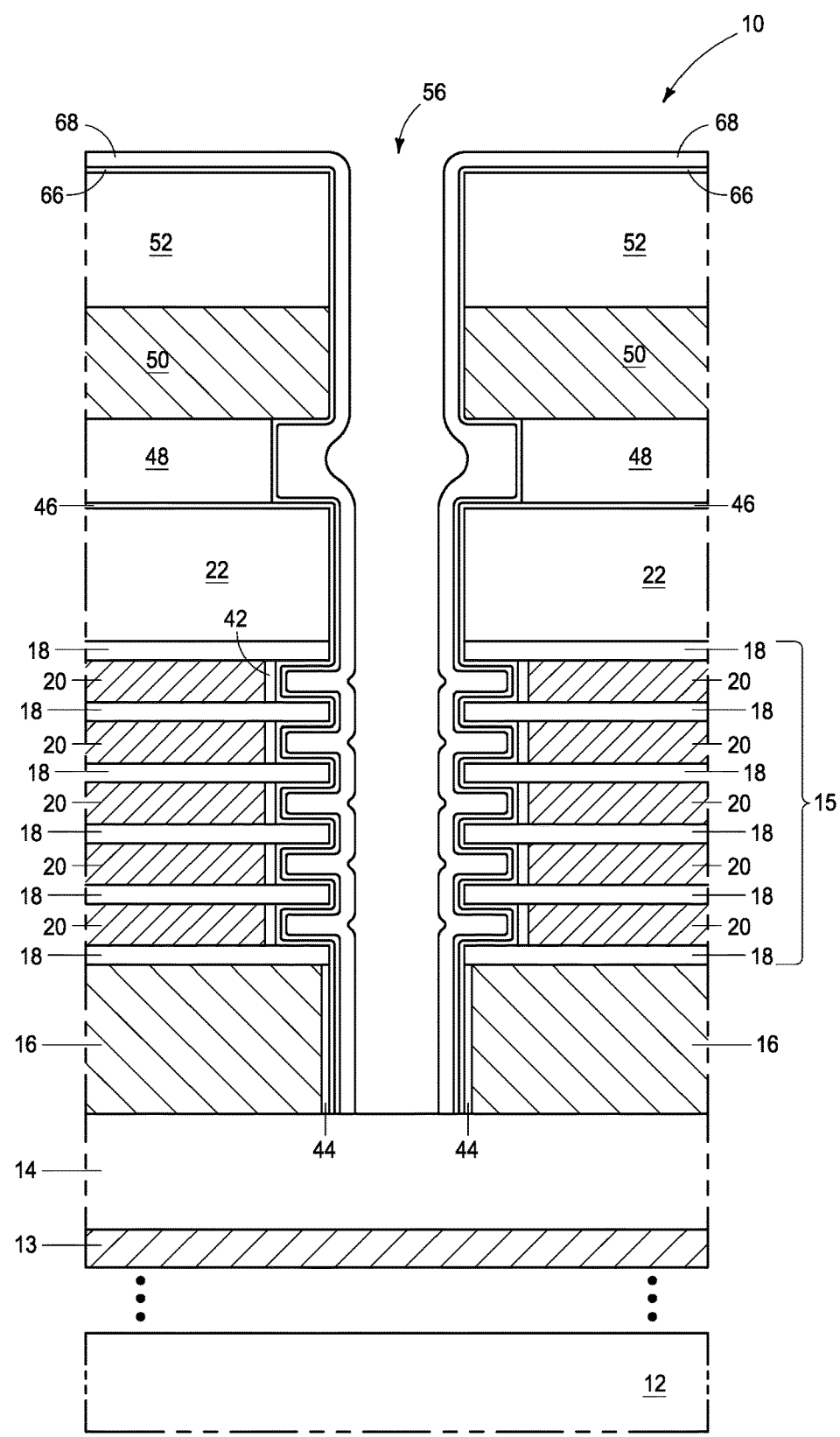

Referring to FIG. 7, oxide 66 and charge-storage material 68 are formed to extend into opening 56, and within cavities 40 (FIG. 6).

The oxide 66 may comprise any suitable composition or combination of compositions; and in some embodiments may comprise, consist essentially of, or consist of one or more of silicon dioxide, hafnium oxide, zirconium oxide, etc.

The charge-storage material 68 may comprise any suitable composition or combination of compositions; and in some embodiments may comprise floating gate material (for instance, doped or undoped silicon) or charge-trapping material (for instance, silicon nitride, metal dots, etc.).

Figure 8:
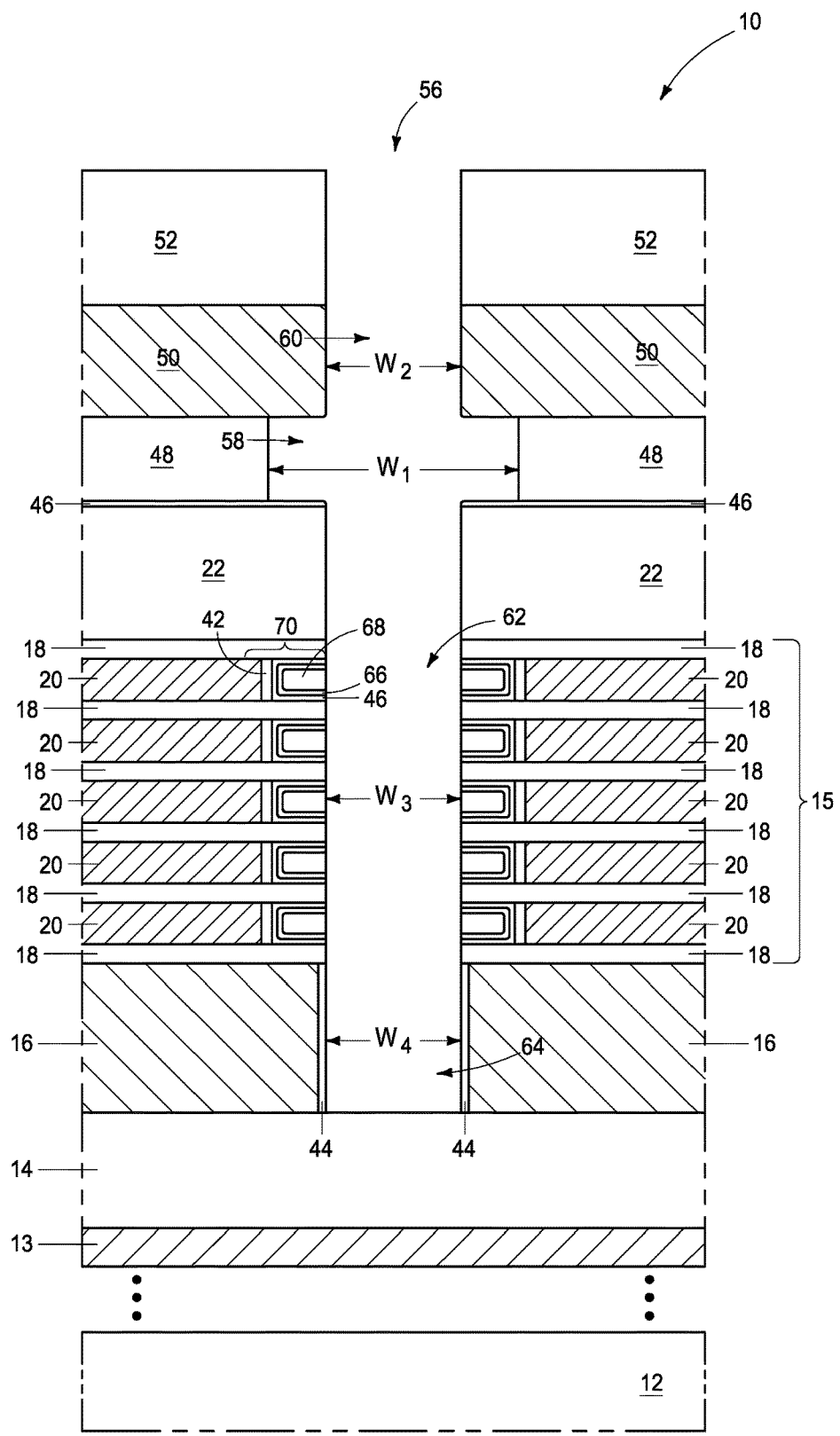

Referring to FIG. 8, materials 46, 66 and 68 are removed from the sidewall surfaces of opening 56, while leaving the materials 46, 66 and 68 within cavities 40 (FIG. 6). The material 68 within the cavities forms charge-storage structures (for instance, floating gate structures); the conductive levels 20 form control gate structures adjacent the charge-storage structures; and the oxide 42, material 46 and material 66 together form charge-blocking dielectric between the charge-storage structures and the control gate structures. The conductive levels 20, charge-storage structures, and charge-blocking dielectric together become memory cell structures 70 (only one of such is labeled). A plurality of such memory cell structures are vertically stacked one atop another in the illustrated embodiment.

The opening 56 comprises the regions 58, 60, 62 and 64 described above with reference to FIG. 6; with region 58 being wider than regions 60, 62 and 64.

Figure 9:
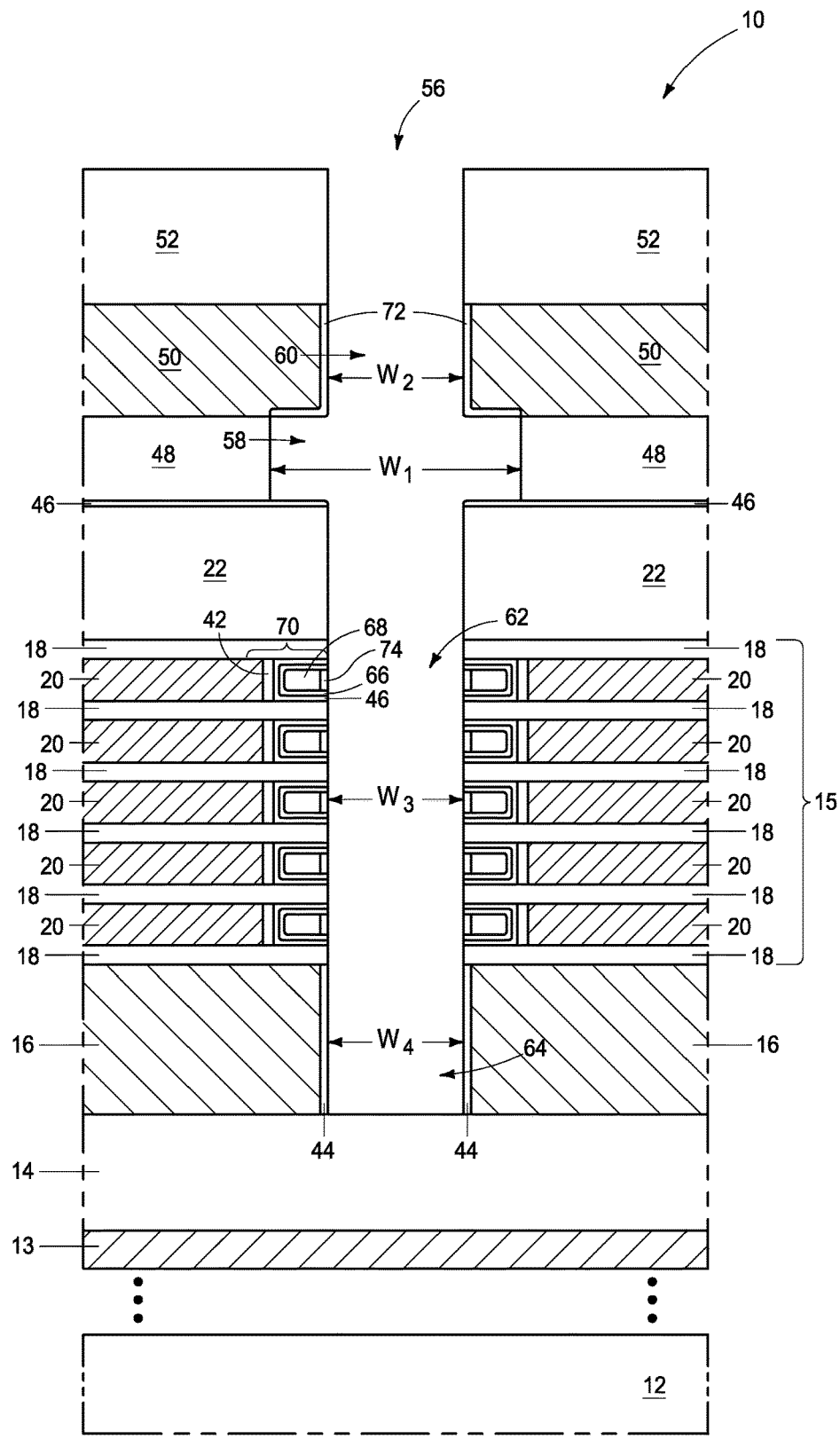

Referring to FIG. 9, exposed surfaces of SGD material 50 and charge-storage material 68 are oxidized to form regions 72 and 74. In some embodiments, materials 50 and 68 comprise silicon, and accordingly regions 72 and 74 may comprise, consist essentially of, or consist of silicon dioxide. The regions 74 may correspond to gate dielectric of the memory cell structures 70.

Although the oxide 44 adjacent (i.e., along) SGS material 16 is shown remaining unaltered at the processing stage of FIG. 9, in some embodiments the removal of materials 66 and 68 described above with reference to FIGS. 7 and 8 may remove some or all of oxide 44, and a new oxide may be formed adjacent the SGS material 16 during the formation of oxides 72 and 74 at the processing stage of FIG. 9.

The opening 56 comprises the regions 58, 60, 62 and 64 described above with reference to FIG. 6; with region 58 being wider than regions 60, 62 and 64. Such regions may have the dimensions described above with reference to FIG. 6.

Figure 10:
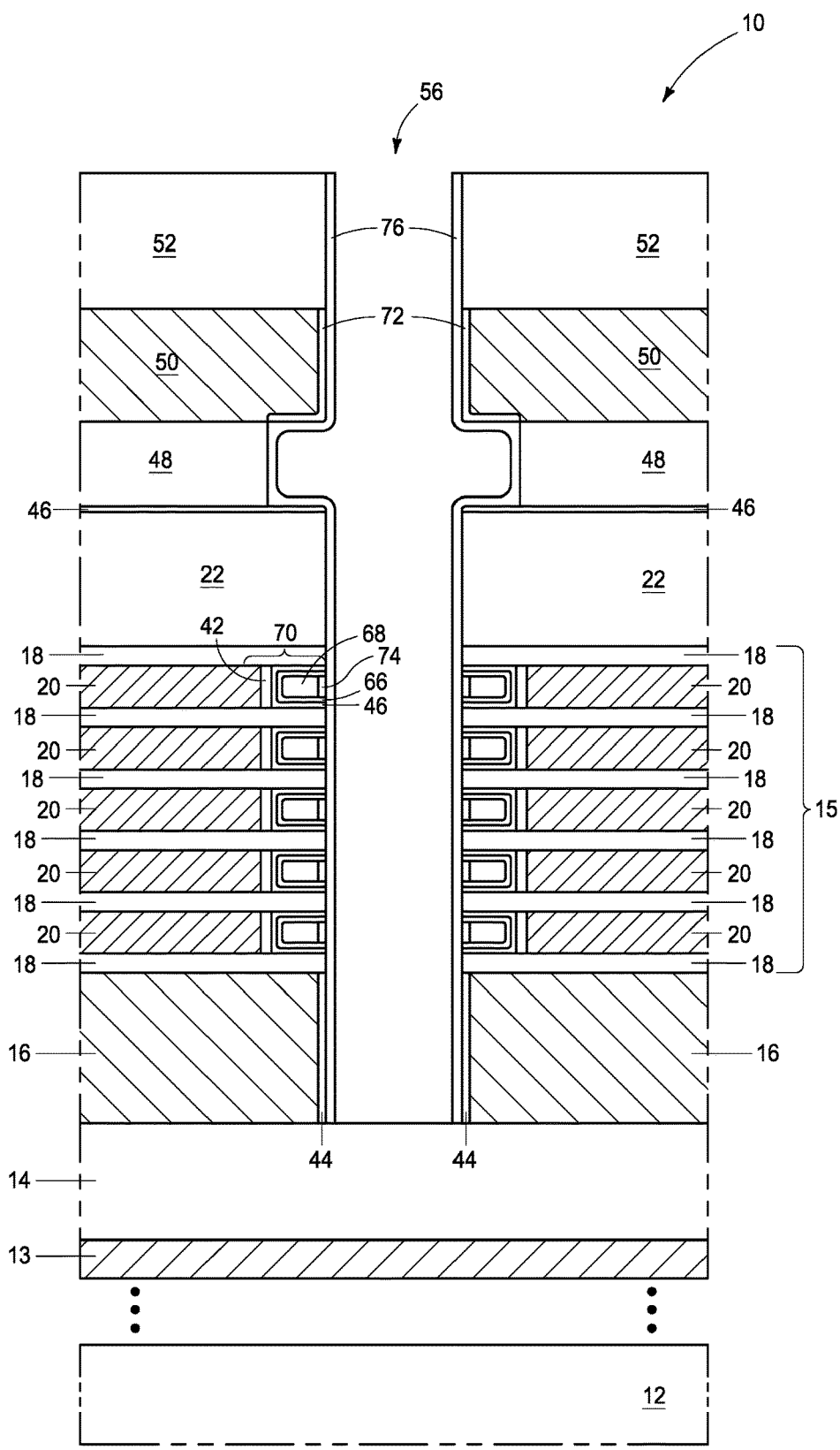

Referring to FIG. 10, protective material 76 is formed adjacent (i.e., along) sidewalls of opening 56. The protective material 76 is a sacrificial material, and may comprise any suitable composition or combination of compositions. For instance, in some embodiments the protective material 76 may comprise one or more of silicon nitride, polysilicon, etc. The protective material 76 lines sidewalls of opening 56, and leaves a bottom of the opening exposed. The protective material 76 may be formed in the shown configuration with any suitable methodology. For instance, the protective material may be formed by depositing the protective material as a liner that extends along the bottom surface of opening 56, along the top surface of material 52, and along the sidewall surfaces of opening 56; then an anisotropic etch of the protective material may be utilized to remove the protective material from along the bottom of the opening and from over a top of material 52.

Figure 11:
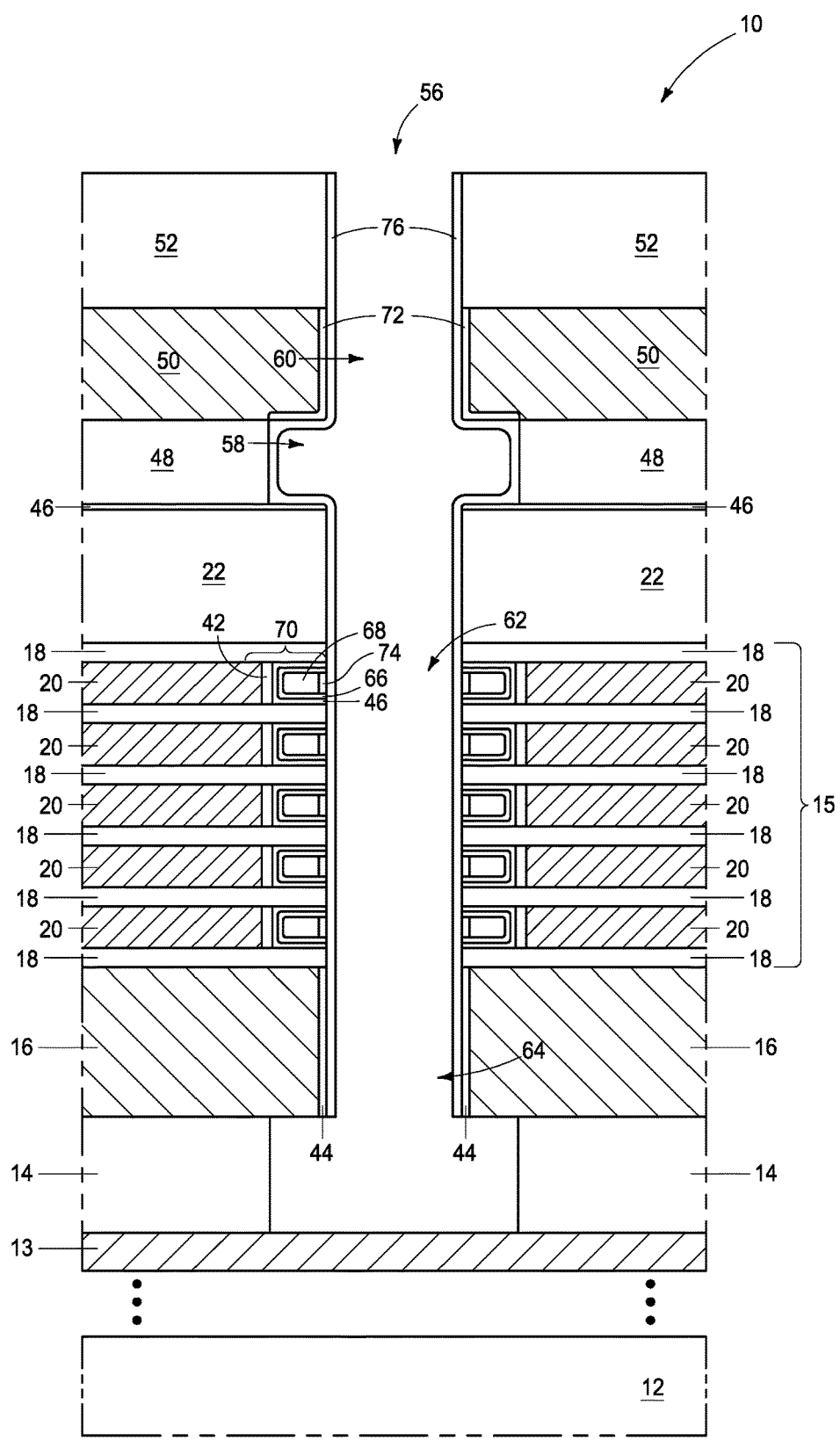

Referring to FIG. 11, an etch is utilized to punch through the etchstop material 14 at the bottom of the opening 56, which extends the opening to the source material 13. In the shown embodiment, the etch has extended only to an upper surface of the source material. In other embodiments, the etch may penetrate partially into the source material. The etch may be followed by a cleaning step; and the etch and associated cleaning step may widen the portion of opening 56 within material 14 relative to other regions of the opening (as shown).

The protective material 76 protects the gate dielectric 74, oxide 44 and oxide 72 from being degraded by the etch conditions utilized to punch through the etchstop material 14.

Figure 12:
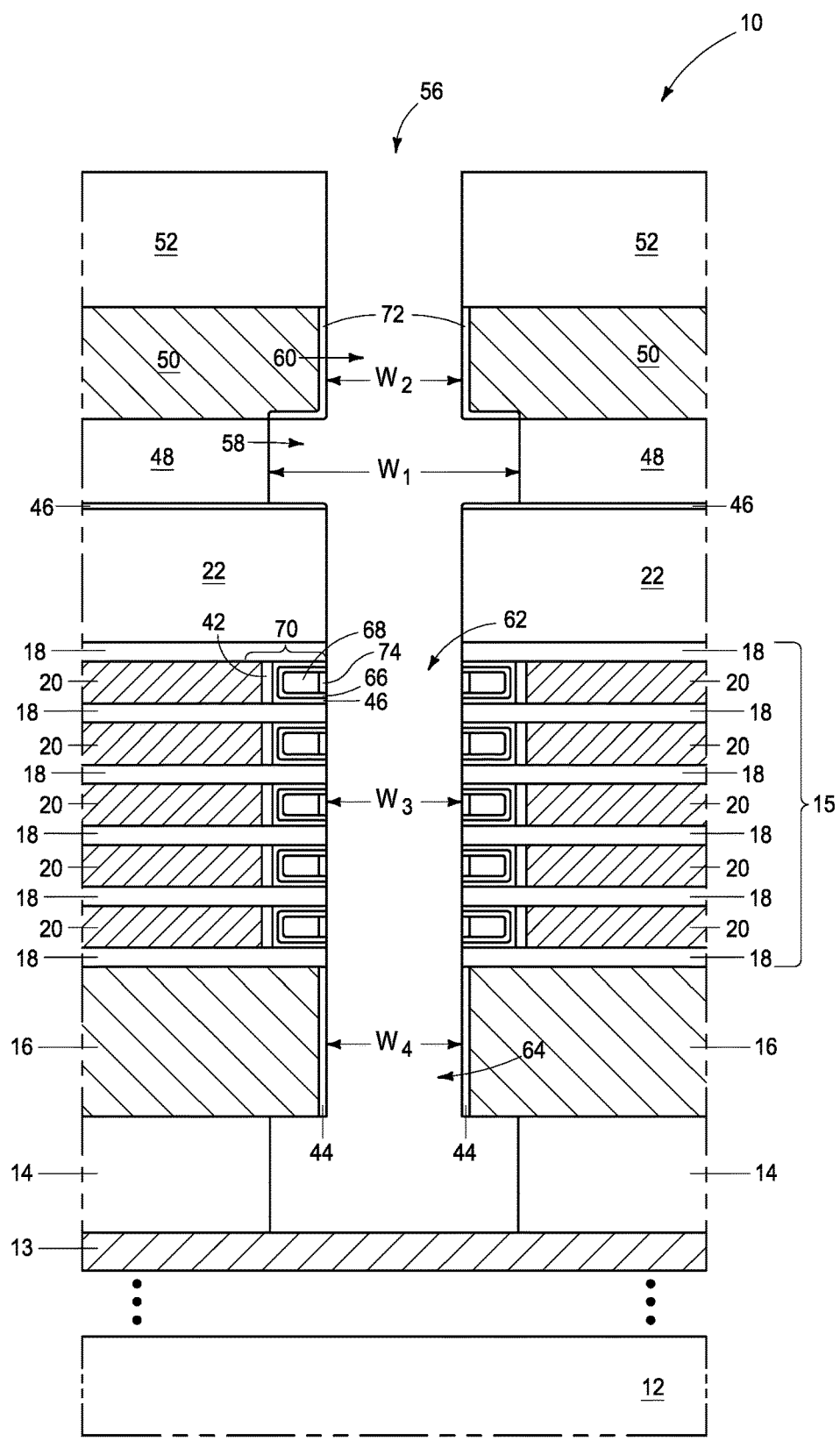

Referring to FIG. 12, the protective liner material 76 (FIG. 10) is removed. The remaining opening 56 comprises the regions 58, 60, 62 and 64 described above with reference to FIG. 6; with region 58 being wider than regions 60, 62 and 64.

Figure 13:
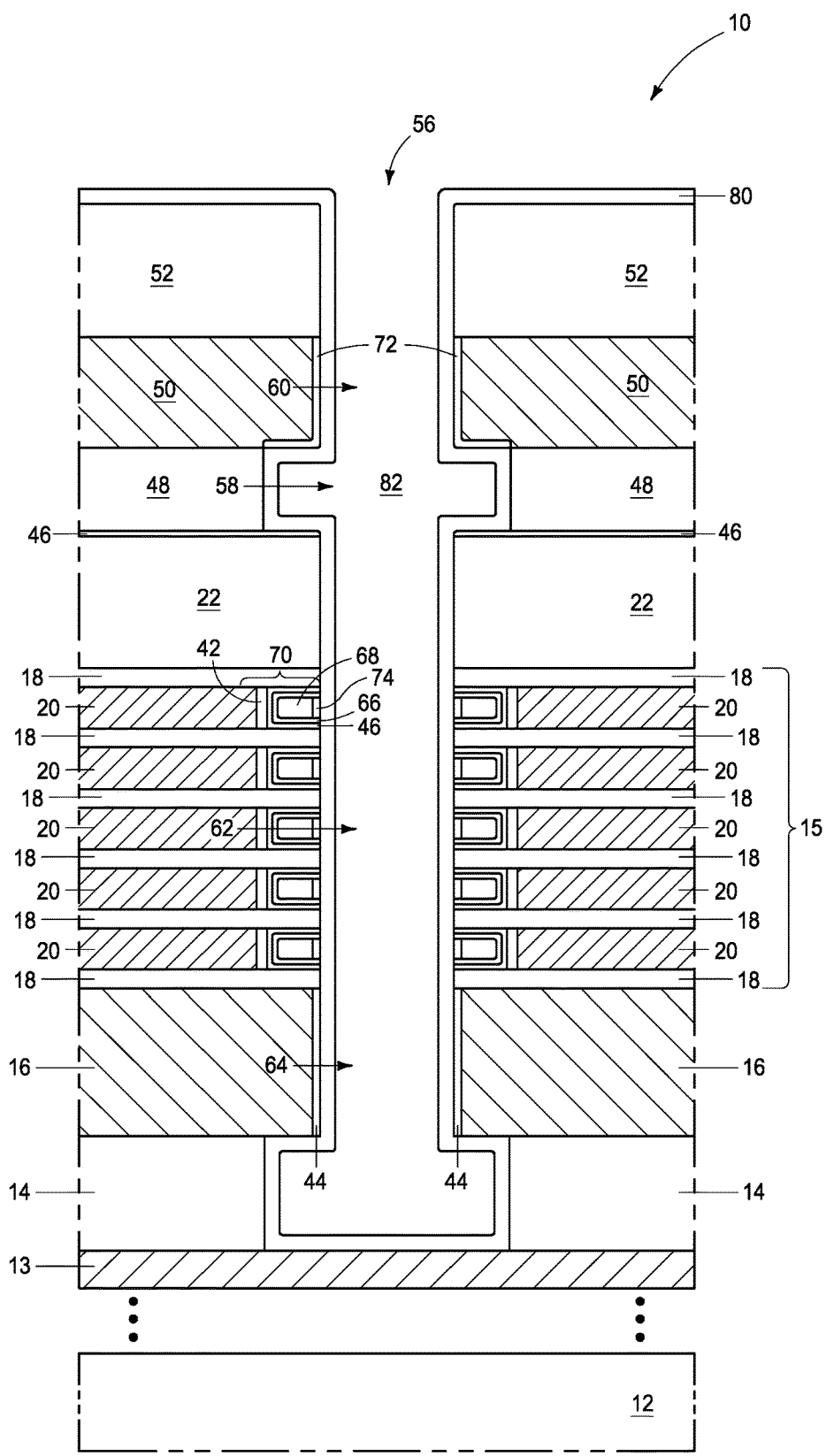

Referring to FIG. 13, channel material 80 is deposited within opening 56. The channel material may comprise any suitable composition or combination of compositions; and in some embodiments may comprise appropriately-doped silicon.

The channel material 80 extends across all of the regions 58, 60, 62 and 64 of opening 56; and forms a single monolithic channel material extending adjacent (i.e., along) SGD material 50, SGS material 16, dielectric levels 18, and memory cell structures 70. The illustrated channel material is a single layer which lines the sidewalls and bottom of opening 56 at the processing stage of FIG. 13. In other embodiments, the channel material may entirely fill the opening 56 at the processing stage of FIG. 13 rather than lining peripheral surfaces of such opening.

Conventional fabrication of vertical NAND may form channel material along gate dielectric in a separate processing step from the formation of channel material along the SGD material. Accordingly, the channel material will not have the monolithic configuration of FIG. 13, but instead will have two different structures which join one another; with a first of the structures being along the SGD material, and a second of the structures being along the memory cells. A problem with such conventional configurations is that there may be poor electrical contact between the first and second channel material structures leading to poor device performance; and/or there may be poor uniformity during semiconductor fabrication processes so that some devices have better contact between the first and second channel material structures than other devices leading to undesired performance variation across a batch of devices, or across numerous batches of devices. The monolithic channel material of FIG. 13 may alleviate or prevent such problems, and accordingly processing described herein may reduce costs and improve quality as compared to conventional processes.

Figure 14:
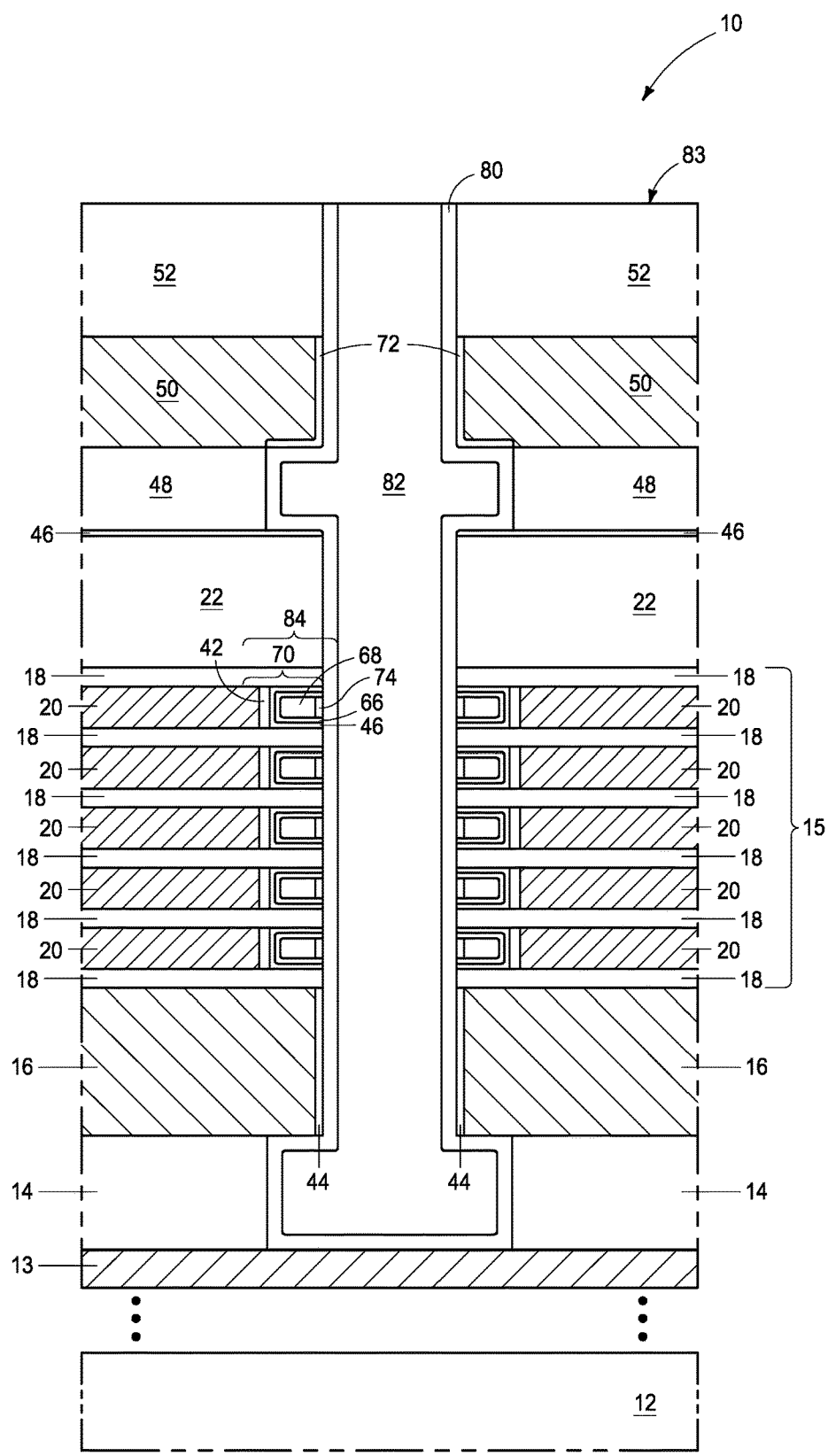

Referring to FIG. 14, opening 56 is filled with insulative material 82 (e.g. silicon dioxide) and then construction 10 is subjected to planarization (for example, chemical-mechanical polishing). The planarization forms a planarized upper surface 83 extending across materials 52, 80 and 82.

The construction of FIG. 14 is an integrated structure, and comprises vertically-stacked memory cells 84 containing the memory cell structures 70 in combination with the channel material 80. In some embodiments, such memory cells may be incorporated into a NAND memory array, and may be considered to be a vertical string of memory cells.

The memory structures described above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include an integrated structure having a stack of alternating dielectric levels and conductive levels, vertically-stacked memory cells within the conductive levels, an insulative material over the stack and a select gate material over the insulative material. An opening extends through the select gate material, through the insulative material, and through the stack of alternating dielectric levels and conductive levels. A first region of the opening within the insulative material is wider along a cross-section than a second region of the opening within the select gate material, and is wider along the cross-section than a third region of the opening within the stack of alternating dielectric levels and conductive levels. Channel material is within the opening and adjacent the insulative material, the select gate material and the memory cells.

Some embodiments include a method of forming vertically-stacked memory cells. A first insulative material is formed over a stack of alternating dielectric levels and conductive levels. A first opening is formed through the first insulative material and through the stack of alternating dielectric levels and conductive levels. Cavities are formed to extend into the conductive levels along sidewalls of the first opening. A silicon nitride liner is formed within the first opening and extends into the cavities. A second insulative material is formed over the silicon nitride liner and over the first insulative material. The second insulative material covers the first opening and does not extend downwardly into the first opening to an uppermost level of the stack. A remaining portion of the first opening is beneath the second insulative material. Select gate material is formed over the second insulative material. A second opening is formed the through the select gate material and the second insulative material, and to the remaining portion of the first opening. The first and second openings join with one another and together form a third opening. After forming the third opening: charge-storage structures are formed within the cavities; regions of the silicon nitride liner not within the cavities are removed; and channel material is formed within the third opening and adjacent the second insulative material, adjacent the select gate material, adjacent the dielectric levels of the stack, and adjacent the charge-storage structures.

Some embodiments include a method of forming vertically-stacked memory cells. An opening is formed to extend through a select gate material, through an insulative material under the select gate material, and through a stack of alternating dielectric levels and conductive levels under the insulative material. The stack includes memory cells within the conductive levels. A first region of the opening within the insulative material is wider along a cross-section than a second region of the opening within the select gate material, and is wider along the cross-section than a third region of the opening within the stack of alternating dielectric levels and conductive levels. Channel material is formed within the opening adjacent the insulative material, adjacent the select gate material, adjacent the dielectric levels of the stack, and adjacent the memory cells.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated structure, comprising:
    a stack of alternating dielectric levels and conductive levels;
    memory cells within the conductive levels;
    an insulative material over the stack;
    a select gate material over the insulative material;
    an opening extending through the select gate material, through the insulative material, and through the stack of alternating dielectric levels and conductive levels; a first region of the opening within the insulative material being wider along a cross-section than a second region of the opening within the select gate material, and being wider along the cross-section than a third region of the opening within the stack of alternating dielectric levels and conductive levels;
    channel material within the opening and adjacent the insulative material, the select gate material and the memory cells;
    cavities extending into the conductive levels;
    charge-blocking material and charge-storage structures within the cavities; and
    wherein the memory cells include the charge-blocking material and charge-storage structures.

2. The integrated structure of claim 1 wherein the insulative material comprises silicon dioxide.

3. The integrated structure of claim 1 wherein the select gate material is drain-side select gate material and comprises conductively-doped silicon.

4. The integrated structure of claim 1 wherein the second and third regions of the opening are about a same width as one another along the cross-section.

5. The integrated structure of claim 1 wherein the conductive levels comprise conductively-doped silicon.

6. The integrated structure of claim 1 comprising oxide between the select gate material and the channel material.

7. The integrated structure of claim 1 wherein the insulative material is a third insulative material; wherein a first insulative material is over the stack, a second insulative material is over the first insulative material, and the third insulative material is over the second insulative material.

8. The integrated structure of claim 7 wherein the first, second and third insulative materials comprise silicon dioxide, silicon nitride and silicon dioxide, respectively.

9. The integrated structure of claim 1 wherein the opening extends through a source-side select gate material and to a conductive source material, and wherein the first region of the opening is wider than a fourth region of the opening within the source-side select gate material along the cross-section.

10. An integrated structure, comprising:
    a conductive source material over a semiconductor substrate;
    a source-side select gate material over the conductive source material;
    a stack of alternating dielectric levels and conductive levels over the source-side select gate material;
    memory cells within the conductive levels;
    an insulative material over the stack;
    a drain-side select gate material over the insulative material;
    an opening extending through the drain-side select gate material, through the insulative material, and through the stack of alternating dielectric levels and conductive levels, through the source-side select gate material and to the conductive source material; a first region of the opening within the insulative material being wider along a cross-section than a second region of the opening within the select gate material, and being wider along the cross-section than a third region of the opening within the stack of alternating dielectric levels and conductive levels;
    channel material within the opening and adjacent the insulative material, the select gate material and the memory cells;
    cavities extending into the conductive levels;
    charge-blocking material and charge-storage structures within the cavities; and
    wherein the memory cells include the charge-blocking material and charge-storage structures.

11. The integrated structure of claim 10 wherein the first region of the opening is wider than a fourth region of the opening within the source-side select gate material along the cross-section.

12. The integrated structure of claim 10 wherein the charge-storage structures comprise floating gate material.

13. The integrated structure of claim 10 wherein the charge-storage structures comprise charge-trapping material.

* * * * *